(12) United States Patent
Przybylski

(10) Patent No.: US 8,902,910 B2
(45) Date of Patent: Dec. 2, 2014

(54) RING-OF-CLUSTERS NETWORK TOPOLOGIES

(71) Applicant: MOSAID Technologies Incorporated, Ottawa (CA)

(72) Inventor: Steven Przybylski, Ann Arbor, MI (US)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

(21) Appl. No.: 14/057,102

(22) Filed: Oct. 18, 2013

(65) Prior Publication Data
US 2014/0115190 A1    Apr. 24, 2014

Related U.S. Application Data

(63) Continuation of application No. 12/013,148, filed on Jan. 11, 2008, now Pat. No. 8,594,110.

(51) Int. Cl.
| | |
|---|---|
| *H04L 12/28* | (2006.01) |
| *G06F 13/42* | (2006.01) |
| *H04L 12/46* | (2006.01) |
| *H04L 12/42* | (2006.01) |

(52) U.S. Cl.
CPC ........ *H04L 12/4637* (2013.01); *G06F 13/4243* (2013.01); *H04L 12/42* (2013.01)
USPC ........................................................ 370/403

(58) Field of Classification Search
None
See application file for complete search history.

(56) References Cited

U.S. PATENT DOCUMENTS

| | | |
|---|---|---|
| 4,617,566 A | 10/1986 | Diamond |
| 4,663,706 A | 5/1987 | Allen et al. |
| 5,132,635 A | 7/1992 | Kennedy |
| 5,204,669 A | 4/1993 | Dorfe et al. |
| 5,243,703 A | 9/1993 | Farmwald et al. |

(Continued)

FOREIGN PATENT DOCUMENTS

| | | |
|---|---|---|
| CN | 1581838 | 2/2005 |
| EP | 0607546 | 7/1994 |

(Continued)

OTHER PUBLICATIONS

Przybylski, Steven A.; U.S. Appl. No. 12/013,148, filed Jan. 11, 2008; Ring-Of-Clusters Network Topolgies.

(Continued)

*Primary Examiner* — Otis L Thompson, Jr.
(74) *Attorney, Agent, or Firm* — Conley Rose, P.C.; J. Robert Brown, Jr.

(57) ABSTRACT

In a ring-of-clusters network topology, groups of slave devices are accessed in parallel, such that the latency around the ring is proportional to the number of clusters and not proportional to the number of integrated circuits. The devices of a cluster share input and output ring segments such that packets arriving on the input segment are received and interpreted by all the devices in a cluster. In other embodiments, none, some or all but one slaves per cluster are asleep or otherwise disabled so that they do not input and interpret incoming packets. Regardless, in all embodiments, the slaves of a cluster cooperate, potentially under the controller's direction, to ensure that at most one of them is actively driving the output segment at any given time. The devices may be addressed through a device ID, a cluster ID, or a combination thereof. Embodiments of the invention are suited to exploit multi-chip module implementations and forms of vertical circuit stacking.

21 Claims, 14 Drawing Sheets

(56) References Cited

U.S. PATENT DOCUMENTS

| | | |
|---|---|---|
| 5,319,598 A | 6/1994 | Aralis et al. |
| 5,323,060 A | 6/1994 | Fogal et al. |
| 5,404,460 A | 4/1995 | Thomsen et al. |
| 5,430,859 A | 7/1995 | Norman et al. |
| 5,452,259 A | 9/1995 | McLaury |
| 5,475,854 A | 12/1995 | Thomsen et al. |
| 5,502,289 A | 3/1996 | Takiar et al. |
| 5,602,780 A | 2/1997 | Diem et al. |
| 5,671,178 A | 9/1997 | Park et al. |
| 5,740,379 A | 4/1998 | Hartwig |
| 5,777,345 A | 7/1998 | Loder et al. |
| 5,778,419 A | 7/1998 | Hansen et al. |
| 5,802,399 A | 9/1998 | Yumoto et al. |
| 5,828,899 A | 10/1998 | Richard et al. |
| 5,841,974 A | 11/1998 | Krone et al. |
| 5,859,809 A | 1/1999 | Kim |
| 5,941,974 A | 8/1999 | Babin |
| 6,002,638 A | 12/1999 | John |
| 6,144,576 A | 11/2000 | Leddige et al. |
| 6,148,364 A | 11/2000 | Srinivasan et al. |
| 6,304,921 B1 | 10/2001 | Rooke |
| 6,317,350 B1 | 11/2001 | Pereira et al. |
| 6,317,352 B1 | 11/2001 | Halbert et al. |
| 6,392,991 B1 | 5/2002 | Yamamoto et al. |
| 6,594,183 B1 | 7/2003 | Lofgren et al. |
| 6,658,509 B1 | 12/2003 | Bonella et al. |
| 6,680,904 B1 | 1/2004 | Kaplan et al. |
| 6,715,044 B2 | 3/2004 | Lofgren et al. |
| 6,763,426 B1 | 7/2004 | James et al. |
| 6,779,072 B1 | 8/2004 | Sauder et al. |
| 6,816,933 B1 | 11/2004 | Andreas |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,996,644 B2 | 2/2006 | Schoch et al. |
| 7,031,221 B2 | 4/2006 | Mooney et al. |
| 7,032,039 B2 | 4/2006 | DeCaro |
| 7,130,958 B2 | 10/2006 | Chou et al. |
| 7,180,778 B2 | 2/2007 | Kawai et al. |
| 7,262,506 B2 | 8/2007 | Mess et al. |
| 7,309,923 B2 | 12/2007 | Kee |
| 7,475,174 B2 | 1/2009 | Chow et al. |
| 7,739,526 B2 | 6/2010 | Kark et al. |
| 2002/0188781 A1 | 12/2002 | Schoch et al. |
| 2003/0014462 A1 | 1/2003 | Bennett et al. |
| 2003/0043855 A1 | 3/2003 | Yamamoto et al. |
| 2004/0001380 A1 | 1/2004 | Becca et al. |
| 2004/0024960 A1 | 2/2004 | King et al. |
| 2004/0148482 A1 | 7/2004 | Grundy et al. |
| 2004/0230752 A1 | 11/2004 | Blake et al. |
| 2005/0030902 A1 | 2/2005 | Choi et al. |
| 2005/0166006 A1 | 7/2005 | Talbot et al. |
| 2006/0031593 A1 | 2/2006 | Sinclair |
| 2006/0104270 A1 | 5/2006 | Chen et al. |
| 2006/0140150 A1 | 6/2006 | Olvera-Hernandez et al. |
| 2006/0146821 A1 | 7/2006 | Singh et al. |
| 2007/0064629 A1 | 3/2007 | Regev et al. |
| 2007/0076479 A1 | 4/2007 | Kim et al. |
| 2007/0076502 A1 | 4/2007 | Pyeon et al. |
| 2007/0109833 A1 | 5/2007 | Pyeon et al. |
| 2007/0233903 A1 | 10/2007 | Pyeon |
| 2007/0234071 A1 | 10/2007 | Pyeon |
| 2008/0016269 A1 | 1/2008 | Chow et al. |
| 2009/0009406 A1 | 1/2009 | Chu et al. |

FOREIGN PATENT DOCUMENTS

| | | |
|---|---|---|
| JP | 2006079618 A | 3/2006 |
| JP | 2006202280 | 8/2006 |
| KR | 20060079117 A | 7/2006 |
| TW | 532011 | 5/2003 |
| TW | I264956 | 10/2006 |
| TW | 12383978 | 7/2007 |

OTHER PUBLICATIONS

Office Action dated Aug. 5, 2010; U.S. Appl. No. 12/013,148, filed Jan. 11, 2008; 21 pages.

Final Office Action dated Mar. 1, 2011; U.S. Appl. No. 12/013,148, filed Jan. 11, 2008; 20 pages.

Office Action dated Oct. 17, 2011; U.S. Appl. No. 12/013,148, filed Jan. 11, 2008; 19 pages.

Final Office Action dated Apr. 26, 2012; U.S. Appl. No. 12/013,148, filed Jan. 11, 2008; 24 pages.

Office Action dated Oct. 25, 2012; U.S. Appl. No. 12/013,148, filed Jan. 11, 2008; 20 pages.

Final Office Action dated Apr. 4, 2013; U.S. Appl. No. 12/013,148, filed Jan. 11, 2008; 26 pages.

Notice of Allowance dated Jul. 19, 2013; U.S. Appl. No. 12/013,148, filed Jan. 11, 2008; 13 pages.

Taiwanese Search Report; Application No. 098100742; Dec. 23, 2013; 1 page.

Oshima, Y. et al, "High-Speed Memory Architectures for Multimedia Applications—Meeting The Requirements of Higher Performance", Circuits and Devices, IEEE 8755-3996/97, Jan. 1997, 8-13,.

Erciyes, Kayhan, "Distributed Mutual Exclusion Algorithms on a Ring of Clusters", Lecture Notes in Computer Science Dept. 2004, 1-10.

IEEE Standard for a High Perfomance Serial Bus; IEEE Std. 1394-1995, 392 pages, Jul. 22, 1996.

King, Craig, L. et al, "Communicating With Daisy Chained MCP42XXX Digital Potentiometers" Microchip AN747, 1-8, Jan. 30, 2001.

IEEE Standard for High-Bandwidth Memory Interface Based on Scalable Coherent Interface (SCI) Signaling Technology (RAMLINK), IEEE Std. 1596.4-1996, The Institute of Electrical Electronics Engineers, Inc., 98 pages, Mar. 19, 1996.

"A Practical Guide to Serial Storage Architecture for AIX", 1-196, Jul. 1, 1996.

Kennedy, Joseph et al, "A 2GB/S Point to Point Heterogeneous Voltage Capagle DRAM Interface for Capacity-Scalable Memory Subsystems" ISSCC 2004/ Session 1/ DRAM/ 11.8, IEEE International Solid-State Circuits Conference, 1-10, Feb. 15, 2004.

Diamond, Steven L., "Synclink: High-Speed DRAM for the Future", Micro Standards, IEEE Micro, Dec. 1996, 74-75.

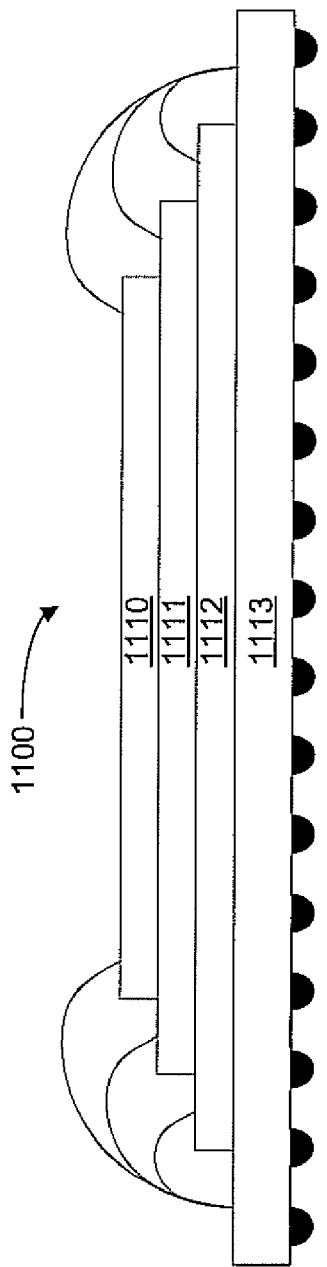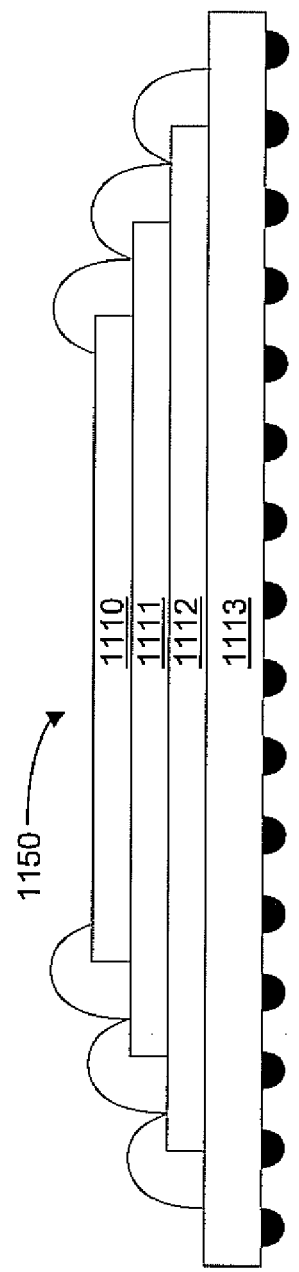

US 8,902,910 B2

RING-OF-CLUSTERS NETWORK TOPOLOGIES

CROSS REFERENCE TO RELATED APPLICATIONS

This application is a continuation of U.S. patent application Ser. No. 12/013,148, filed on Jan. 11, 2008, which is hereby incorporated by reference.

FIELD OF THE INVENTION

The disclosure relates generally to ring-type network topologies and, in particular, to a modified ring topology, called a ring of clusters topology, in which groups of slave devices are accessed in parallel thereby reducing latency while improving fault-tolerance and other properties.

BACKGROUND OF THE INVENTION

In a ring topology interconnection network, all the devices in the subsystem are arranged in a ring or loop configuration, and typically all communication is unidirectional around the ring. As a result, each device in the ring has exactly one other device immediately "before" and exactly one device that is immediately "after" it.

In many ring-topology networks, the ring is physically, and electrically, broken by each device in it. In these networks, the ring itself is made up of a number of ring segments that connect the devices in the ring. The number of segments equals the number of devices in the ring. Communication on each segment is unidirectional and each has a driver end where exactly one device drives information onto the segment, and a one receiver end where exactly one device receives information from the driving device. From the perspective of a device on the ring, the segment of the ring on which it receives information is called its input segment, while the segment onto which it drives information is called its output segment.

It is typical for one device in the ring to be special in that it is the master device. It is often and synonymously referred to as the controller. For example in memory subsystems constructed from such a ring-topology interconnect, the master or controller is typically responsible for both issuing read and write and other commands to the memories on the ring under its control, and for orchestrating data communication around the ring. The other devices in the ring are slaves and are typically but not exclusively memories. These slaves respond to commands from the controller sent over the ring and, in the case of read and other commands, send data back to the controller, also over the ring. Generally, the timing of communication on the ring is determined by the controller and not freely initiated by the slaves.

Ring topologies are popular because they are conceptually simple, generally extensible and can require only a few pins per device. Also, since only point-to-point communication is used, issues of signal integrity and segment length are much more tractable than with many other interconnect topologies. However, three significant drawbacks evident with this class of ring-topology interconnect relate to latency, failure tolerance and power consumption.

With regard to latency, for all networks in this class, the only path from a controller to an accessed device and back to the controller is through all the other devices in the ring. As such, in the case of a controller accessing a slave and commanding it to respond by delivering data back to the controller, the latency of the operation has two primary components: the intrinsic latency of the operation within the slave, and the communication latency around the ring. Since the ring goes through each of the devices, each of these devices will present some small latency to the commands and data flowing round the ring. In addition the ring segments themselves can add a non-trivial amount to communication latency.

An inherent characteristic of this class of ring-topology interconnects then is that total latency around the ring is the sum of all the latency through the devices plus the latency of the ring segments connecting those devices. The total latency around the ring is important since the total slave read access time from a controller to a device and back is the sum of the total ring latency and the slave device's internal read access latency. Reducing total ring latency is an important perquisite for circumstances in which total access latency is a significant component contributing to system-level performance. Thus in some known examples, although a ring topology network may be able to support a large number of devices, on the basis of latency alone, it may be impractical for all applications that involve more than a small handful of devices.

Another significant problem with ring-topology networks is that they are fault-intolerant. If any of the devices or segments on the ring fails, communication around the ring is impossible, even if the other devices are still completely functional. This characteristic of ring-topology networks is significant in some system environments and not others. However, for memory systems in particular, there are many system applications that impose the requirement that the memory subsystem be able to operate flawlessly even in the presence of a single bad device.

A third significant problem with ring-topology networks is that every device in the ring expends power to communicate each packet around the network. Depending on the signaling technology, every slave in the ring expends power on every command packet (regardless of the receiver) and on every read data packet (regardless of the source). In contrast, with some other network topologies, slave devices only expend power to communicate read data back to the controller. So, even though the power expended by a slave per bit transmitted can be less given the point-to-point communication, the total power efficiency of a ring-topology network can be significantly worse than some non-ring alternatives.

There have been previous attempts to mitigate or avoid some of the negative characteristics of ring-topology networks. These efforts fall into four categories. In the first category, the total latency is minimized by keeping the per-device latency as small as possible. This is the approach disclosed in U.S. Pat. No. 5,778,419 and in the RamLink memory interface (IEEE Standard for High-bandwidth Memory Interface Based on Scalable Coherent Interface (SCI) Signaling (RamLink), IEEE Standard 1596.4-1996). Another approach is to limit the total latency around the ring by artificially limiting the number of devices in the ring. This evident in the U.S. Pat. No. 5,778,419, where the number of devices in the ring is limited to 5 (one master and 4 slaves).

A third technique is to create a hierarchy of rings, in which each of the devices on the primary ring (i.e. the ring controlled the overall master) is an agent acting as a master for a subring of slaves (See FIG. 1). Commands targeted at specific slaves are intercepted by the appropriate agent and translated into commands on the single specific sub-ring that includes the targeted slave. A fourth method of dealing with the deficiencies is to have a ring of agents that in turn control non-ring based devices. For example in FIG. 2, each agent controls a traditional parallel memory subsystem.

These previous solutions either fail to fully take advantage of the inherent advantages of a ring topology or fail to adequately address the problems of ring topology networks described above. For example, the ring of rings topology has been calculated to reduce the communication latency for a system with n slaves to 2×sqrt(n) plus any additional scheduling delay in the agent. Reducing the per-slave delay reduces the constant of proportionality, but the total communication latency still remains proportional to the number of devices in the ring. Limiting the number of devices in the ring to a small number caps the total communications latency, but also limits the utility of the interconnect in larger systems.

Some approaches to improve ring network performance involve the use of multi-chip modules. Multi-chip modules are packaging structures in which more than one integrated circuit is housed together with a common set of signal pins to the board or carrier on which the multichip module is mounted. A more precise definition is provided in the Detailed Description section. The straightforward application of integrated circuits in multi-chip modules to a ring-topology interconnect is to serially connect all the devices in the multi-chip module into the ring. The topology and latency of this configuration are as if each integrated circuit was in its own package and the packages were serially connected into the ring. The result would be a package cross section comparable to that shown in FIG. 3, where one can see the link coming into the lowest device on bonding wires, leaving the lowest device and entering the one above it, and so up the stack, culminating with bonding wires connecting the topmost device with the package to form the outbound ring segment.

The configuration of FIG. 3 is less than ideal for several reasons. First, although these devices appear as a single package, they present logically as five devices, presenting five devices worth of latency. Second, this particular arrangement of incoming and outgoing segments on opposing sides of devices may not be convenient. In general, a multi-chip module of n devices presents physically as one device but logically as n devices. This configuration fails to adequately take advantage of the close proximity of the integrated circuits in the multi-chip package to address some of the limitations of large rings where a multi-chip module approach is not taken.

SUMMARY OF THE INVENTION

Embodiments of the invention reside in a modified ring topology, called a ring of clusters topology, in which groups of slave devices (called clusters) are accessed in parallel. The clusters in some respects behave as a single node in the ring. By virtue of this configuration, the latency around the ring is proportional to the number of clusters and not proportional to the number of integrated circuits. Power consumption associated with data communication is less than that in a comparable traditional ring network, and embodiments afford a high degree of fault tolerance. The topology interconnect is well adapted to the use of multi-chip modules and/or individually packaged integrated circuits.

According to embodiments of the invention, groups of devices are connected in parallel, sharing input and output ring segments. Clusters include one or more devices, and in practice the number of devices per cluster would be relatively small. In a number of disclosed embodiments, packets arriving on the input segment are received and interpreted by all the devices in a cluster. In other embodiments, none, some or all but one slaves per cluster are asleep or otherwise disabled so that they do not input and interpret incoming packets. Regardless, in all embodiments, the slaves of a cluster cooperate, potentially under the controller's direction, to ensure that at most one of them is actively driving the output segment at any given time.

A ring-of-clusters network topology according to embodiments of the invention comprises a controller device in packetized communication with a plurality of slave devices interconnected to input and output segments in a ring configuration, wherein at least some of the slave devices are connected in parallel, farming a cluster that shares the same input and output segments. In at least one embodiment, the devices that are addressed by the combination of a cluster ID and a device ID, thereby dramatically reducing the number of bits required and the associated latency.

In at least one of the clusters, a device designated as a cluster master is operative to coordinate the slaves of that cluster so that at most one slave in the cluster is driving the output segment. The slaves of the cluster may communicate over a single wire to the cluster master that a specific slave is primed for data transfer from the input to the output segment. For example, the slaves of the cluster may communicate with the cluster master over a single multi-source single-destination conductor. Alternatively, the cluster master interprets all of the commands targeted at all slaves in the cluster enabling the cluster master to determine which slave is primed without receiving information directly from the slaves. In any case, the cluster master is operative to forward command packets from the input segment to the output segment regardless of which, if any, slaves are primed.

While any appropriate form or integration may be used, some embodiments of the invention are suited to exploit multi-chip module implementations and other forms of vertical stacking in that individual clusters may be assigned to different levels in the stack. This allows the input segment to arrive to all devices on one side of the stack and the output segment to leave from the other side of the stack. Alternatively, the bond wires may connect the input segment bonding pads on one device to bonding pads on the vertically adjacent device, and with a comparable set of connections on the output segment side of the stack. The various devices in the inventive network may be memory devices, although the invention is not limited in this regard.

BRIEF DESCRIPTION OF THE DRAWINGS

Reference will now be made, by way of example, to the accompanying drawings. Similar or the same reference numerals may have been used in different figures to denote similar components.

FIG. 11A shows, in cross section, a diagram of a multi-chip module in which the devices are stacked vertically and which all the devices in the stack form a single cluster in a ring of clusters network;

FIG. 11B shows, in cross section, a diagram of an alternative multi-chip module in which the devices are stacked vertically and which all the devices in the stack form a single cluster in a ring of clusters network;

DETAILED DESCRIPTION OF THE INVENTION

Figure 1:
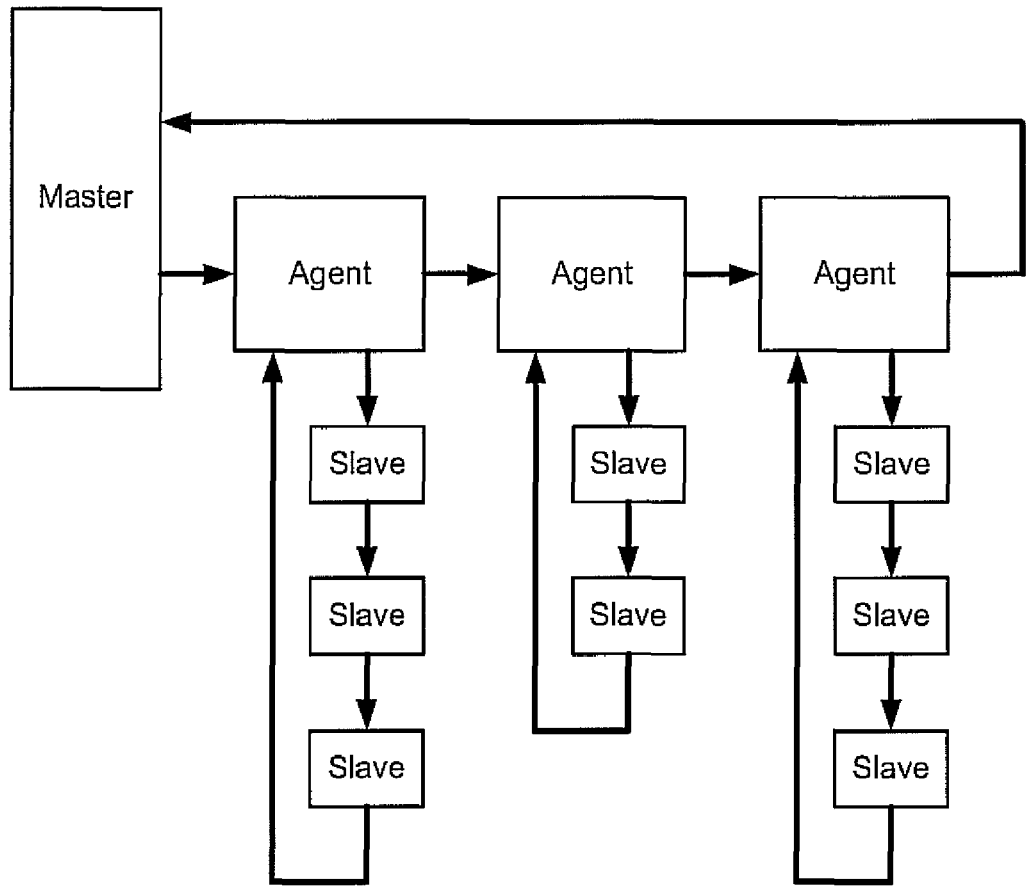
FIG. 1 shows a diagram of a ring of rings in accordance with a topology of the prior art.
Figure 2:
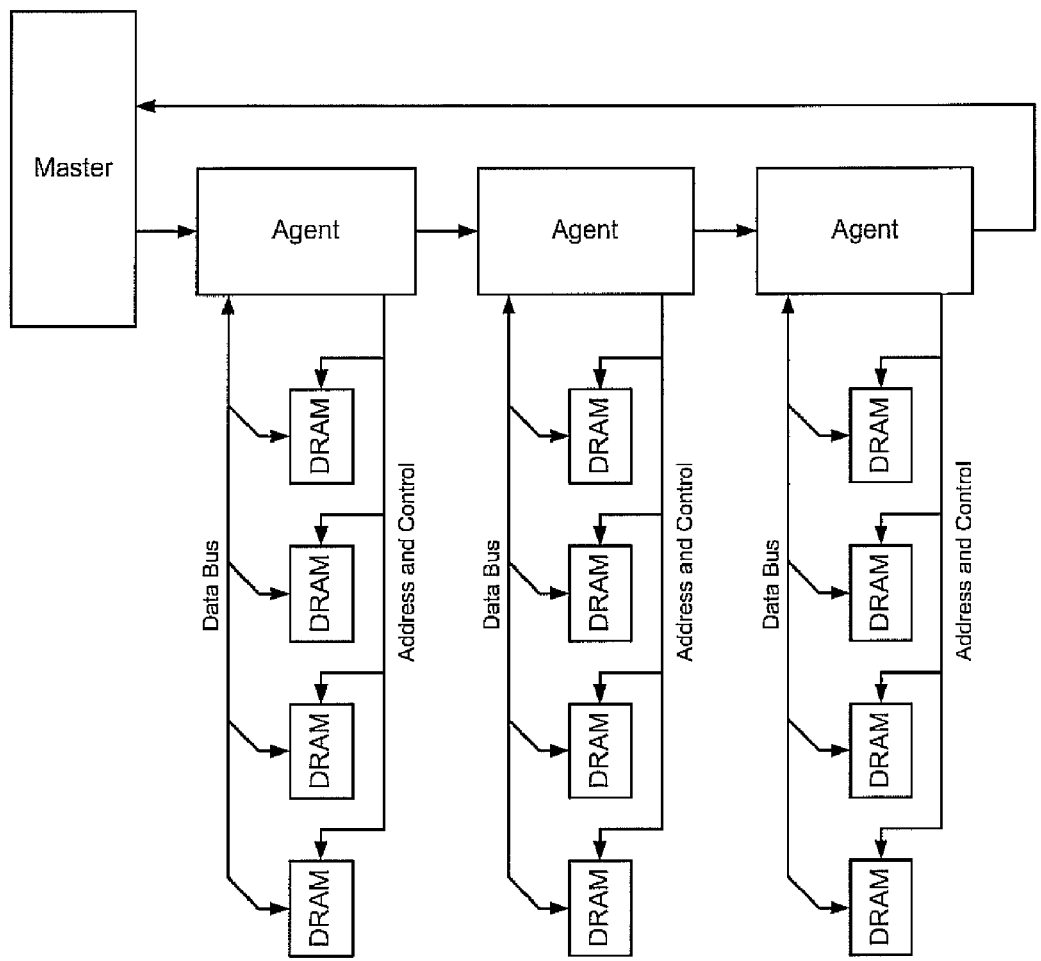
FIG. 2 shows a diagram of a ring of subsystems in accordance with a network topology of the prior art.
Figure 3:
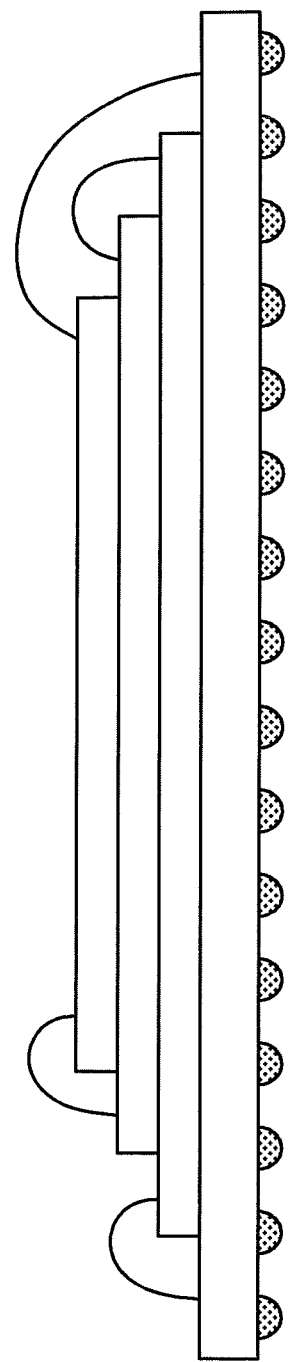
FIG. 3 shows, in cross section, a diagram of a multi-chip module with a ring topology network passing through each device in accordance with the prior art.

Embodiments of the invention address the problem that ring topology interconnects can have long latencies when many devices are included in the ring, which can limit the utility or effectiveness of the interconnect. Embodiments of the invention also solve problems associated with the high power consumption and poor fault-tolerance associated with existing ring network topologies.

Embodiments of the invention relate to ring-topology electronic interconnects in which one device in the ring is controller, but the invention is not limited in this regard and would equally apply of other variations of ring-topology networks and other system and subsystem types. In this specification, the terms "master" and "controller" are used synonymously. Similarly, slaves and memories are used synonymously without limiting embodiments of the invention to slave devices that are primarily memory devices. It is understood that the present invention applies equally to rings including all or some non-memory slaves as well. In addition, in this specification, "interconnect," "network" and "interconnection network" are used synonymously to mean an arbitrary collection of wires (in whole or in part collected into one or more buses) directly or indirectly connect a collection of electronic or comparable devices.

Embodiments of invention also relate to the use multi-chip modules in electronic systems. In many instances, multiple pieces of silicon are packaged together into a single substrate or package. This is commonly done both vertically in which the pieces of silicon are placed on top of one another in a stack, or horizontally, in which the pieces of silicon as placed beside one another within a single package or module. A variant is where multiple pieces of silicon (or more generally, a thin piece of semiconductor material with electronic components manufactured on at least one surface) are individually packaged and then the packages are mounted vertically in a stack. At least example embodiments apply to all these cases, though a disclosed embodiment is described in terms of a stack of pieces of silicon packaged together.

In this disclosure, the expression "multi-chip module" is defined to be a general term for all such packaging or mounting techniques, and not limited to anyone style or type of such structure. Also in this disclosure, an integrated circuit is defined to be a piece of silicon or other semiconductor material with electronic components such as, but not limited to, wires, transistors, diodes, and sensors, fabricated into or on one or more surfaces of the material. The terms device and integrated circuits are used synonymously herein.

The term "module" is defined to be the package or substrate or like structure onto or into which the integrated circuits are mounted and which facilitates the connection of those integrated circuits to conductors on the medium on which the module itself is ultimately mounted. The module itself mayor more not include other structures other than interconnects and mayor may not have other components mounted into or onto it other than integrated circuits. In some multi-chip modules, bond wires connect the integrated circuits to each other and/or the module itself. In others, the integrated circuits make direct connect to the conductors that are part of the module. For example, one common form of multi-chip module is a package in which several integrated circuits are mounted one atop another into a vertical stack and in which bonding wires connect the integrated circuits to the conductors in the module and to each other.

Figure 4:
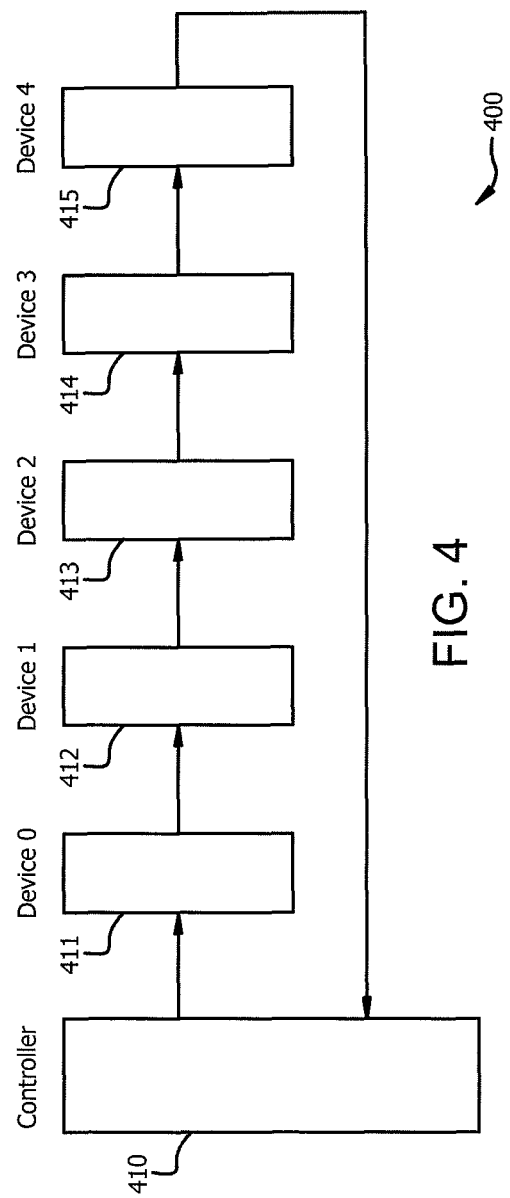
FIG. 4 shows a diagram of an example of a ring topology interconnection network in which one of the devices is a controller or master.
Figure 5:
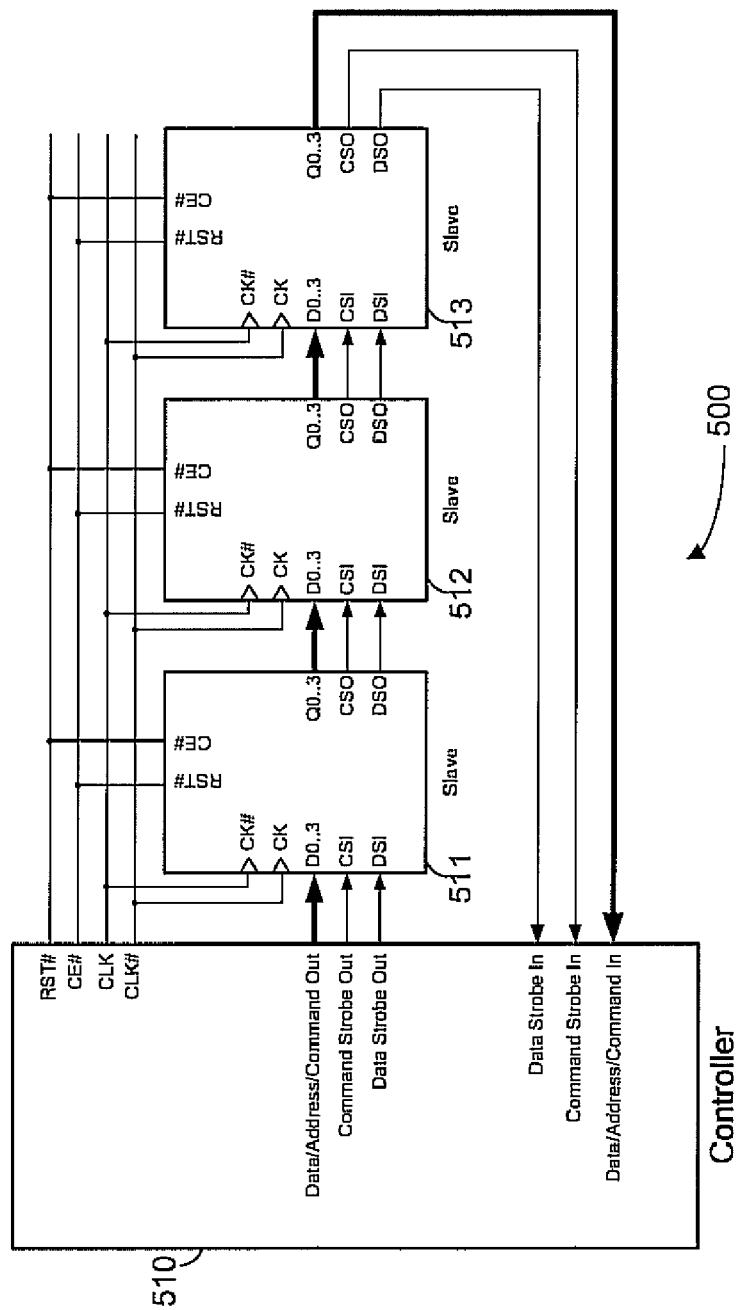
FIG. 5 shows a further diagram of a ring topology network, the diagram showing signals associated with input and output segments.

Reference is now made to FIG. 4 which shows a diagram of example ring topology interconnection network 400. In the network 400, information flows around a unidirectional ring flowing from device to device. In this case, the figure shows a ring in which one of the devices is a controller or master device 410 accessing memories or other memory or non-memory slave devices 411-415. Address, data and control information all flows around the ring in the same direction, typically with the same timing, and typically in part on the same conductors. FIG. 5 shows the signals of one such ring topology network 500. In the illustrated example, the segments of the ring that connect the devices 510-513 into a ring comprise a data path of four conductors, and two strobe signals. Information flows around the ring in packets. FIG. 4 also indicates that each slave in the ring has a unique address. In the illustrated case, the slave addresses begin with 0 with the first slave to receive packets from the controller, and increase consecutively from there to the last slave.

In at least some instances of the illustrated network, the packets comprise either of data originating in a slave device flowing back to the controller or command packets originating at the controller and flowing to one or more slave devices. These two types of packets are called Read Data Packets and Command Packets, respectively. Command Packets include a device address and a command for one or more slaves to execute. The device address portion of the Command Packet is the first byte of the packet and it specifies which device or devices are to execute the command. Depending on the semantics of the command, the remainder of the command packet may include an address of some data storage within the target device(s) and possibly some data as well.

Figure 6:
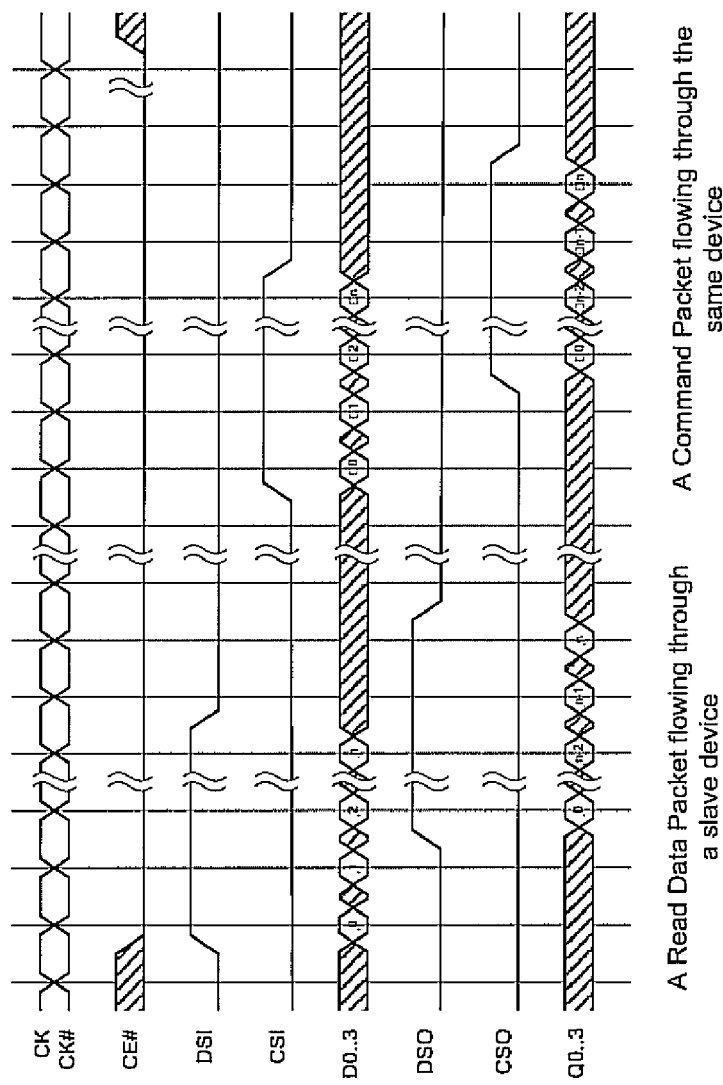
FIG. 6 shows a timing diagram of a Command Packet and a Data Packet flowing into and then out of a slave device of the ring network of FIG. 5.

In at least some instances of the illustrated network, data is transmitted on each edge of the common clock. As there are four data wires, a byte is transmitted each clock period. FIG. 6 shows the relationship between the two strobes and Command or Data Packets flowing into and out of a single slave. When a Command packet is being received by a slave, the, Command Strobe In (CSI) signal delimits the start and end of the packet. When a Data Packet is being received, the incoming packet is delimited by Data Strobe In (DSI).

For both Data and Command Packets, the latency though each device is a small number of clock cycles and it is likely—but not necessarily—fixed as part of the design of the device, though different devices on the ring can have different flow through latencies. The slave implicitly illustrated in the example of FIG. 6 exhibits a flow-through latency of one cycle as both Command and Data Packets appear on the output segment data lines (Q0 . . . 3) one full cycle after they were latched on the input segment. On the output segment, the slave delimits the packets on the output data lines by driving Command Strobe Out and Data Strobe Out correspondingly.

Figure 7:
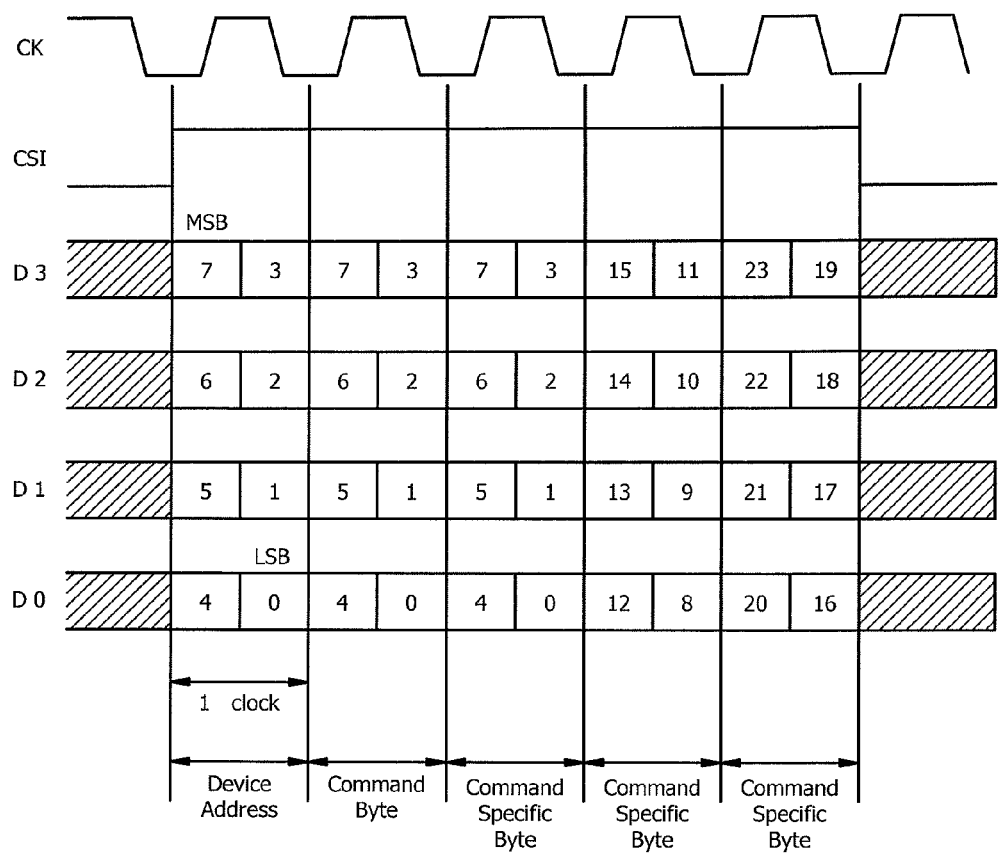
FIG. 7 shows a diagram of the internal structure of a Command Packet.

Slave devices are sent commands in command packets. FIG. 7 shows the structure of command packets which could correspond to the command packet shown in FIG. 6. The first byte comprises the device address of the slave that is to execute the command. The second byte is a one byte command. The number and semantics of subsequent bytes are dependent on the actual command specified. Since the controller determines the subsequent bytes are dependent on the specific command specified in the second byte. In particular, when the controller wishes to write data into a slave's storage, the subsequent bytes would include the slave-local address of that storage and the write data. The command packet illustrated in FIG. 7 is sent most-significant nibble first. One the first rising edge, the most significant nibble, being bits 4,5,6 and 7 are sent on the data line D0, D1, D2, and D3. During the second half of the first clock cycle, the least significant nibble of the first byte, being bits 0,1,2, and 3, are sent on the corresponding data lines. The same pattern follows for all subsequent bytes of the command. In the case of an address with more than 8 bits, such as illustrated in the three command specific bytes of FIG. 7, the sequence of the nibbles and bytes corresponds to least significant byte first and most significant nibble first.

Data Packets can be used to communicate data of all sorts from a slave back to the controller. When the controller wants the slave to return data back to it, it sends a read data transfer command that primes the slave for the arrival of data packet. The read data transfer command indicates what data the controller wants the slave to return to it. When the controller is ready to receive the requested data, it sends a Data Packet down the ring with arbitrary data in it. The start and end of the Data Packet are indicated by the rising and falling edge on the Data Strobe signals (CSO and CSI correspondingly). When the primed slave detects the arrival of the read data packet, it ignores the incoming data in the packet and instead of duplicating it onto the output segment, drives the data previously requested by the data instead. In at least some examples, the amount of data to be transferred is not specified in the read data transfer command, but instead is specified by the number of clock cycles between the rising and falling edge of the Data Strobe In/Out.

In a ring of clusters (clusters ring) topology network according to embodiments of the invention, devices are connected in parallel, sharing input and output ring segments. Clusters include one or more devices, and in practice the number of devices per cluster would be relatively small In a number of embodiments, packets arriving on the input segment are received and interpreted by all the devices in a cluster. In other embodiments, none, some or all but one slave per cluster are asleep or otherwise disabled so that they do not input and interpret incoming packets. In general, the slaves of a cluster cooperate, potentially under the controller's direction, to ensure that at most one of them is actively driving the output segment at any given time. Different examples of embodiments of the invention disclosed herein vary primarily according to how the devices of a cluster cooperate to accomplish this.

Figure 8:
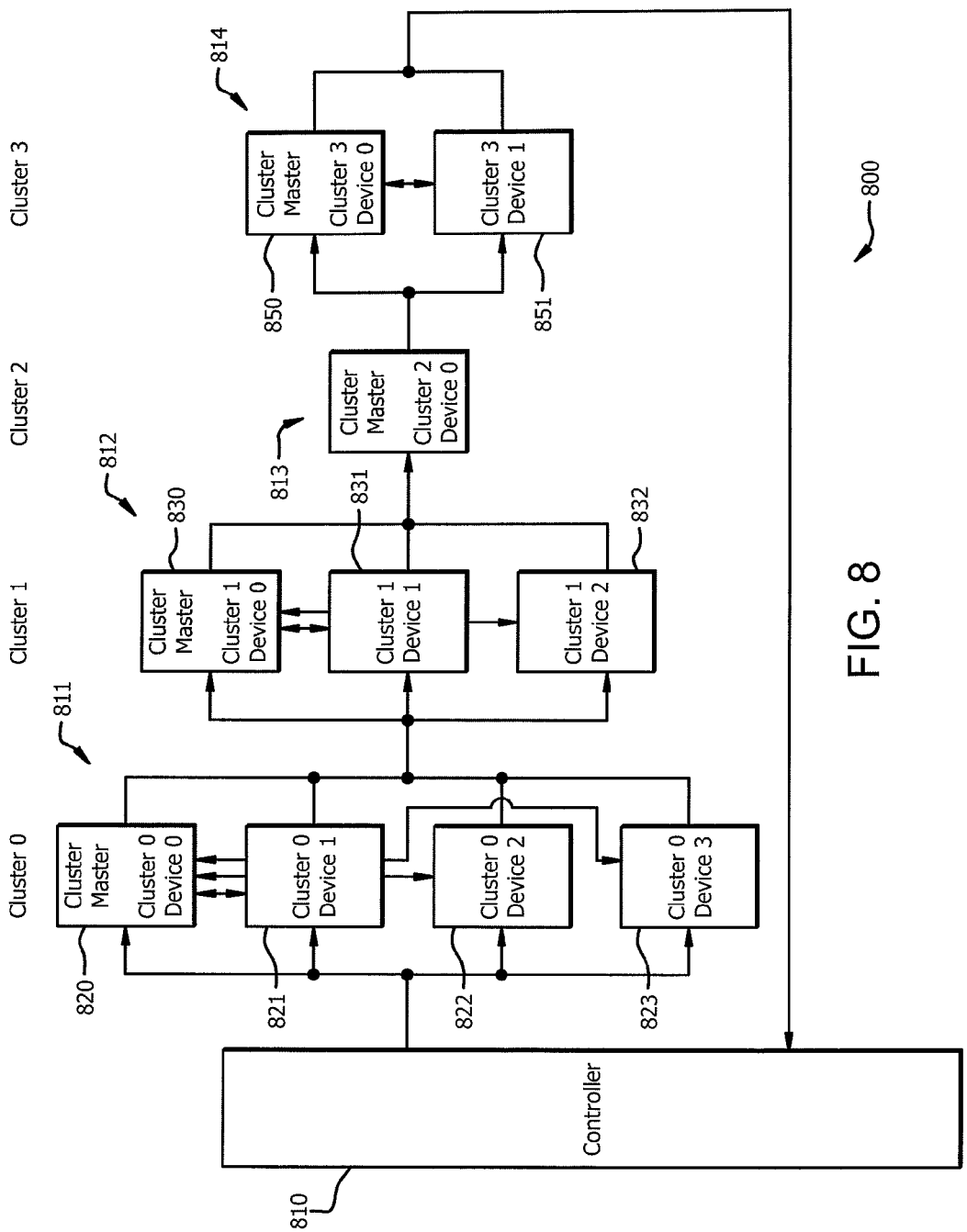
FIG. 8 shows a diagram of a first example of a ring of clusters in accordance with a network topology of an example embodiment.

FIG. 8 is a diagram of an example ring of clusters network 800 showing a ring of one controller 810 and four clusters 811-814. The clusters have four slaves 820-823, three slaves 830-832, one slave 840, and two slaves 850-851 in them, respectively, though the invention is not limited to any specific range of clusters or slaves per cluster. In at least one embodiment, the clusters are given unique cluster IDs. In the example of FIG. 8, the first cluster has cluster ID 0 and subsequent clusters have cluster IDs of 1, 2, and 3. Within each cluster, the devices are also given unique device IDs. Again, in this example, a first slave in the cluster is given a device ID of 0 , and subsequent slaves (if any) are given devices of 1, 2, 3, and so on. Note that in all embodiments of the invention the word "device" should not be taken to mean "discrete." While the various embodiments may be implement with discrete devices, the "devices" may also be integrated onto the same integrated circuit.

Each device in the ring is thereby uniquely identified by the union of its cluster ID and its device ID. For example, a network that supports up to 16 clusters of up to 16 slaves per cluster could have a one byte device address field which was comprised of a 4-bit cluster ID field and a 4-bit device ID field. In this example, if each device in the ring had a flow through latency of one cycle, then a fully populated network would have a communications latency of 16 cycles. In contrast the ring topology network of FIG. 4 with the same number of devices, also with a flow through latency of one, would have a communication latency of 256 cycles. In this way, the ring of clusters topology allows for systems with many more devices without linearly compounding their latencies.

In the embodiment of FIG. 8, the device in each cluster with device ID 0 is called the Cluster Master (it will be understood that some other device ill could be used to identify the cluster master). A role of the cluster master is to coordinate the slaves of the cluster so that at most one slave in the cluster is driving the outbound segment. To this end, there can be a special wire from each non-Cluster Master slave in the cluster to the Cluster Master of the cluster. This wire is used to communicate to the Cluster Master that a specific slave is primed. The Cluster Master is responsible for driving the output segment (strobes as well as the output data bus) except when a Data Packet is received and another slave in the cluster is primed. In this circumstance the Cluster Mater drives the Data Strobe Out signal but releases the Data Out signals (i.e. its output drivers enter a high impedance state) so that the primed slave can insert its read data into the Data Packet.

In another embodiment, a single conductor connects all the slaves in the cluster. In such an embodiment, the following condition would hold: at most one slave in the entire ring can be primed at once, so there can be at most one primed slave per cluster. Therefore a single multisource single-destination conductor (also referred to an n:1 communication) can be used to indicate to the master that a slave is primed.

In yet another embodiment, the Cluster Master interprets all of the commands targeted at all slaves in its cluster so that it knows when any other slaves in its cluster are primed and so it does not need to receive an indication from the other slaves in the cluster that they are individually primed or not. This embodiment could be valuable in situations where the Cluster Master device knows a priori the command set of all the other slaves in the cluster. This would certainly be the case in homogenous clusters, and less likely in heterogeneous clusters in which devices coupled together into a cluster were of completely different types or of different versions of the same type.

In all of the above-described embodiments, the primed slave can also be responsible for driving the Data Strobe Out signal as well as the Data Out Signal when it is primed and a Data Packet arrives. However, the Cluster Master would remain responsible for forwarding Command Packets from the cluster's Input Segment to its Output Segment regardless of which if any slaves are primed.

In another comparable group of embodiments, a primed device becomes a temporary master and becomes responsible for forwarding Command Packets as well as Data Packets from the Input Segment to output Segment, regardless of whether it's currently inserting read data into a Data Packet. Cluster Master can either revert to device 0 of the cluster when a primed device no longer becomes primed. Depending on the specifics of the network protocol this could be at the end of the Data Packet, at the start of a new Command Packet after end of the Data Packet into which the primed slave device has inserted read data, or some other condition. This reversion to an unprimed state can be communicated to the Cluster Master by any of the previously described methods or implicitly understood by the Cluster Master.

Figure 9:
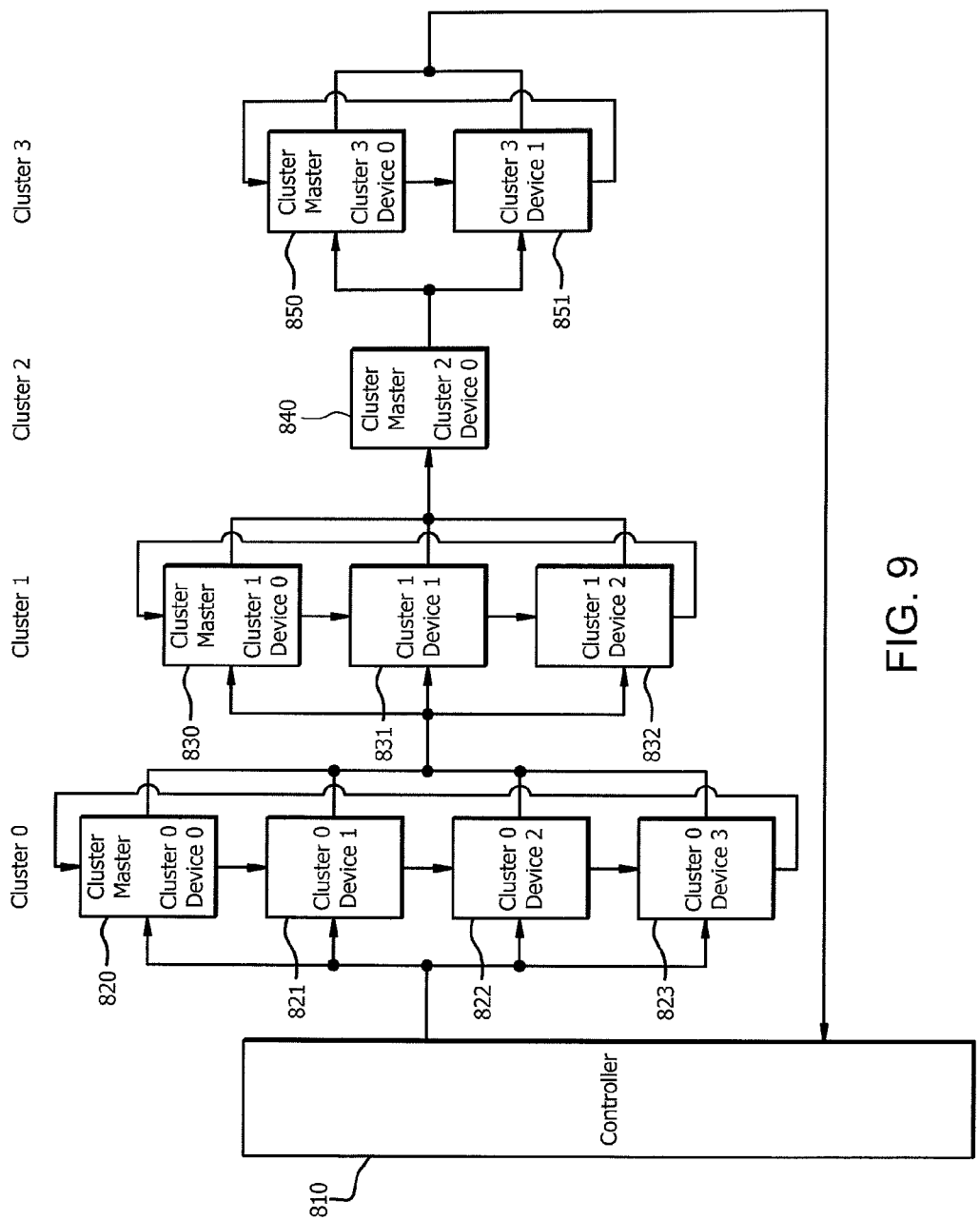
FIG. 9 shows a diagram of a second example of a ring of clusters having a different intra-cluster communication signals arrangement than that of FIG. 8.

In another alternative, temporary master status remains with a primed device even after it is not primed, and does so until such time as some other slave in the cluster becomes primed. At that point temporary master status transfers to the newly primed device and remains with that device until some other device in the cluster becomes primed. For this set of embodiments, communication of primed status can be communicated by means of a ring of single conductors, or by a shared wire. In the former case, a newly primed device sends a rising edge down the intra-cluster single-conductor ring (see FIG. 9). Each device in the link forwards the rising edge to the next slave in the intra-cluster ring. When that rising edge reaches the current temporary master, it relinquishes temporary cluster master status and forwards the rising edge to the next slave in the cluster. When the rising edge returns to the newly primed slave, it is assured that it now has temporary cluster master status and that it now has responsibility for forwarding Command and Data Packets to the cluster's output segment. Other signaling conventions and interconnection topologies for communicating and arbitrating primed status and temporary cluster master status will be apparent to one of ordinary skill.

In at least one embodiment, the beginning of one packet follows the end of the previous packet by at least one half cycle. This gap ensures that there is an opportunity for clusters to shift responsibility for driving all of some elements of the cluster's output segment while there is no data being transferred.

Alternatively, the signaling technology used on the outbound segment is of a wired-AND type. With this type of signaling technology, if more than one devices drives a signal, then the received value is the logical AND of the two driven values. For example, an open-collector driver with an external pull-up resistor is an example of a wired-AND signaling technology: if either of two driving devices pulls the output signal low, then the received value is low. Other wired-AND and their counterpart wired-OR signaling technologies are well known to those skilled in the art.

In these embodiments, the Cluster Master continuously drives the Output Segment, copying incoming Command and Data Packets to the output segment, exactly as in the network of FIG. 8. Non-Cluster Master Slaves only drive read data onto the outgoing segment Data Out Lines, overwriting the data placed there by the controller. The controller fills all outgoing Data packets with 1 s so that when the data in the Data Packet is logical ANDed with the read data from a primed slave, the resulting data that reaches the controller is exactly the read data from the primed device. The slaves need not communicate with their cluster-mates. They only need to be aware of whether they are a Cluster Master or not. For comparable embodiments using other wired-type signaling technologies, the initial value inserted into outbound Data Packets from the controller are filled with the identity value for the logical function implemented by the signaling technology.

In all embodiments, each device in the ring is uniquely identified with an address. In at least one embodiment, as described above, the slaves have a device ID that is unique within each cluster. In at least one embodiment, each slave determines its Cluster ID and Device ID by sensing the voltage on dedicated ID input lines (equal in number to the number of bits in the union of the Cluster ID and the Device ID).

Note that the Device IDs may set after reset by taking advantage of a reset signal that is daisy chained though each of the devices in the cluster. Every slave has both a Reset In signal and a Reset Out signal. The Reset In of the Cluster Master slave can be connected to the global system reset. The Reset Out signal of each cluster master can be connected to the Reset In signal of the slaves in their respective cluster that will end up with a device ID of 1, and so on. The ring subsystem comes out of a reset state with a simple high to low transition of Reset. The first device in each cluster recognizes that simple, single transition on Reset In as indication that it is the corresponding Cluster Master and that its device ID is 0. Each Cluster Master then de-asserts Reset Out with a series of three transitions: high to low, low to high then high to low again. The next device recognizes the series of three transitions on reset as an indication that it is the second device in the cluster and that therefore its device ID is 1.

This pattern is continued, with each device counting the number of transitions in Reset In to determine its own device ID, and then increasing the number of transitions by two to ensure that the next device is assigned a device ID that is one greater. After the device IDs are all set, the cluster ID values can be set the same way that the device IDs can be set: after the ring is reset, the controller sends a special packet down the ring with all zeros. Every slave in the entire network takes the value as its cluster ID. The Cluster Master of each cluster increments the value in the special packet before sending it on to the next cluster. Alternatively, the controller can fill the special packet with some other value and the Cluster Masters can increment, decrement or otherwise operate on the value in the special packet to create the cluster ID of the next cluster. One of ordinary si cill in the art will recognize that the sense of the reset signal is not of inventive significance.

Figure 10:
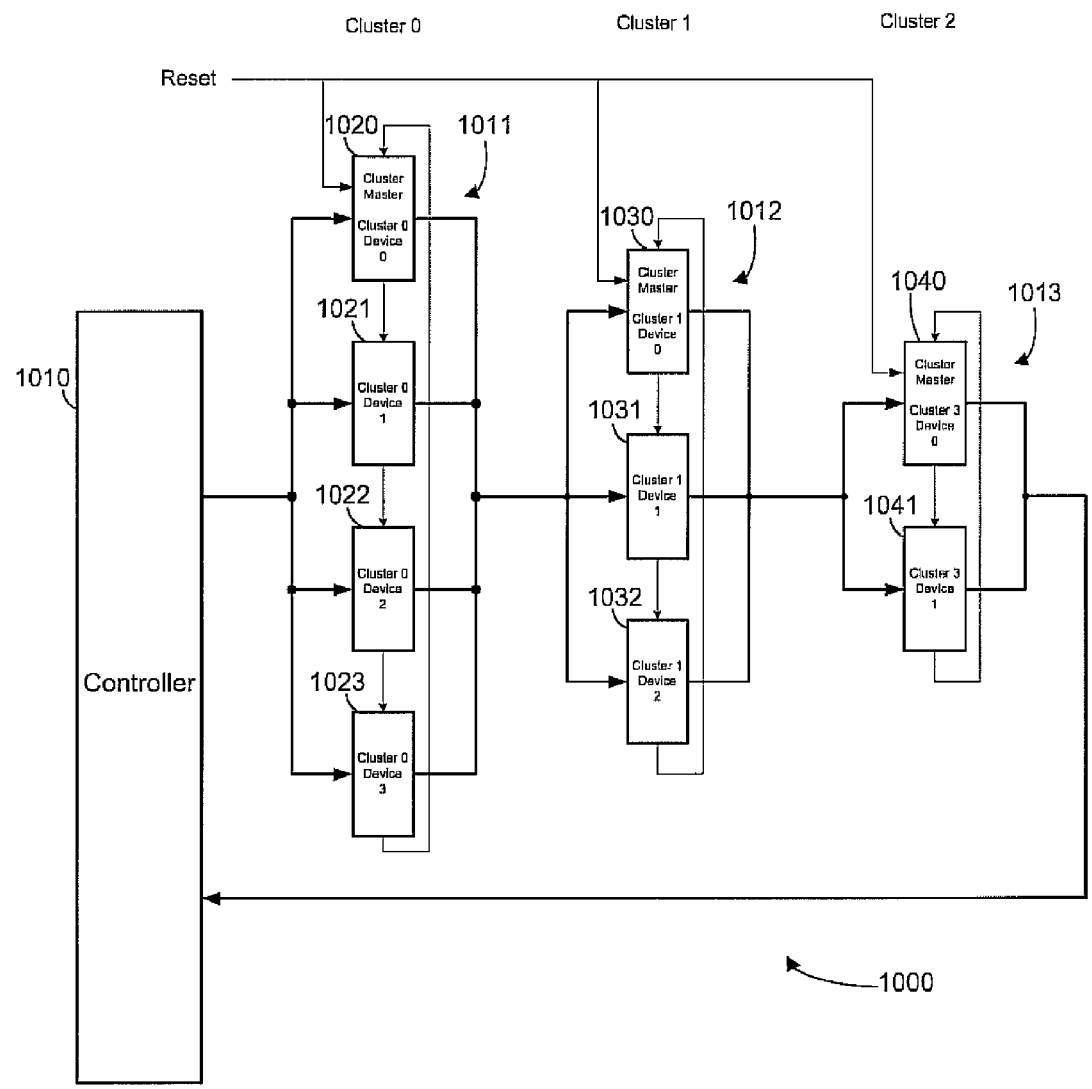
FIG. 10 shows how an intra-cluster ring used to arbitrate the temporary cluster master status is used to communicate device IDs.

FIG. 10 shows a diagram of another ring of clusters network 1000 in accordance with another example embodiment. The network 1000 includes a controller 1010 and three clusters 1011-1013. The clusters have four slaves 1020-1023, three slaves 1030-1032, and two slaves 1040-1041 in them, respectively, though it is again noted that the invention is not limited to any specific range of clusters or slaves per cluster. In the configuration of FIG. 10, the intra-cluster ring used to arbitrate the temporary cluster master status is used to communicate device IDs. All slaves have a Reset In input. All slaves that are not Cluster Masters have those inputs grounded. The Cluster Masters have their Reset In inputs connected to the global ring reset. On the recognition of a high to low transition of Reset In, the Cluster Masters recognize their status as Cluster Masters, set their device IDs to zero, and send a comparable growing pulse stream down the intra-cluster ring to sequentially initialize the cluster IDs of all the other devices in the cluster.

In another embodiment, the indication of which device in each cluster in the Cluster Master is hard wired by use of a dedicated signal. The cluster IDs are set first, using the procedure described above for setting the cluster IDs, followed by the setting of the device IDs, again by the procedure described above for setting the device IDs. In another embodiment, a dedicated set of signals, separate from the reset signals and the temporary cluster master arbitration signals are used to initialize the device IDs in accordance with techniques apparent to those of skill in the art.

Referring now to FIG. 11A, a vertically stacked multi-chip module 1100 is shown in which all devices 1110-1113 in the stack constitute a single cluster. The input segment arrives to all devices on one side and the output segment leaves out the other side of the module. FIG. 11B shows the same stack of devices 1110-1113 in an alternate module 1150 differing from the module 1100 in that the bond wires connect the input segment bonding pads on one device to bonding pads on the vertically adjacent device, and with a comparable set of connections on the output segment side of the stack. Note that in such implementations the stack may include more than one cluster, one or more clusters and a controller, and so forth.

In at least one known ring network, if any device fails, round-trip communication between the controller and all the devices ceases. In accordance with embodiments of the invention, however, if a non-cluster master fails completely, communication would continue unobstructed. The failed device would never assert its indicator that it had been primed. If the failed device failed in such a way as to continuously assert that it had been primed, then the ability to communicate with the devices of that cluster might be inhibited. However, communication with the other clusters would be unaffected. If a Cluster Master failed, then round-trip communication would be interrupted.

Figure 12:
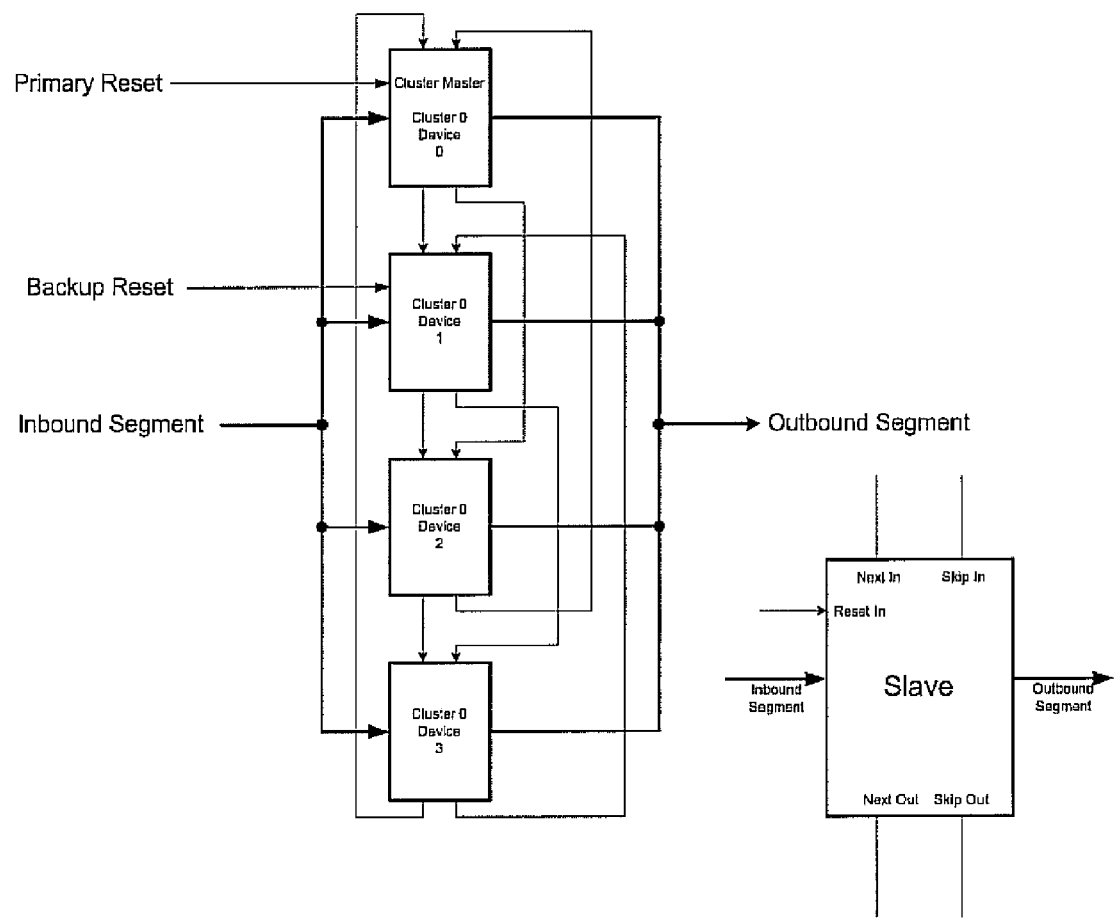
FIG. 12 shows a diagram of a cluster within a ring of clusters topology interconnection network in accordance with at least one example.

FIG. 12 represents an alternative embodiment that is able to function despite the failure of anyone device per ring. In it each slave has two intra cluster outputs (called Next Out and Skip Out) and two intra cluster inputs called Next In and Skip In. Next Out of each device is connected to Next In of the logically next device in the cluster, and Next Out of the last device is connected to Next In of the first device—the device that is normally the Cluster Master. The Next signals thereby form a simple intra cluster ring.

Skip Out of each device is connected to Skip In of the next but one device in the cluster. The Skip Out of the next to last slave connects to Skip In of the first slave in the cluster, and Skip Out of the last slave in the cluster connects to Skip In of the second slave in the cluster. In this fault-tolerant embodiment, each fault-tolerant cluster has at least two slaves in it, and therefore it is always unambiguous which is the next but one slave connects to which via the Skip signals. The Reset In signals of the first two slaves in the cluster are connected to two ring-global signals, called Primary Reset and Backup Reset.

Initialization and assignment of device IDs proceeds as follows. The controller raises Primary Reset and maintains it high for a sufficient time for it to be recognized by the first slave in each cluster. This first slave then assigns itself to be Cluster Master and sets its device ID to be 0. It then raises Next Out and Skip Out, and all other slaves in the cluster propagate a high level on either Skip In or Next In to both Skip Out and Next Out and put themselves into a reset state.

When Primary Reset drops, the Cluster Master recognizes the falling edge and sends a pulse train of three transitions to the second device on Next Out (high to low, low to high, then high to low again), and a pulse train of five transitions on Skip Out. Every other slave in the cluster follows the following rules: when either Next In or Skip Out is high for an extended period, enter a reset state and clear the slave's device ID and cluster ID; When in a reset state watch for a transition train on both Next In and Skip In. If a transition train comes in on either signal, count the number of transitions, subtract one and divide by two and set the device ID to the result. Ignore subsequent transition trains on either input. When the device ID is set, send a transition train on Next Out of length 2×device ID+3 on Next Out and send a transition train of length 2×device ID+5 transitions on Skip Out. Thereafter enter normal operating mode and watch the Inbound Segment for a special packet to set the cluster ill as described above. The Cluster Master can watch for transition trains on its Next In and Skip In in order to understand the number of devices in its cluster.

If after this, the controller is unable to see a packet go all the way around the ring, it is possible that one of the primary cluster masters is dead in the sense that it has failed in a manner that prevents normal operation. In which case it should reinitialize using the Backup Set. This will set the second slave in each cluster to be the Cluster Master with Device ID 0.

This embodiment facilitates operation with one dead slave per ring. A related embodiment that functions despite up to one slave failure per cluster is identical except that the controller has the ability to use the primary or backup reset on a cluster-by-cluster basis. As such, if the first slave on the first cluster and the second device in the second cluster are both bad, the controller can still separately assign Cluster Masters in the two clusters accordingly. Additional embodiments utilizing extensions of this concept are possible that facilitate operation with multiple device failures per cluster.

Since the fault-tolerant cluster of FIG. 12 communicates with the previous cluster in the ring (or the controller) and the next cluster (or the controller) by the same previously described protocol-, a single ring can include a mix of fault tolerant clusters and non-fault tolerant clusters.

Figure 13:
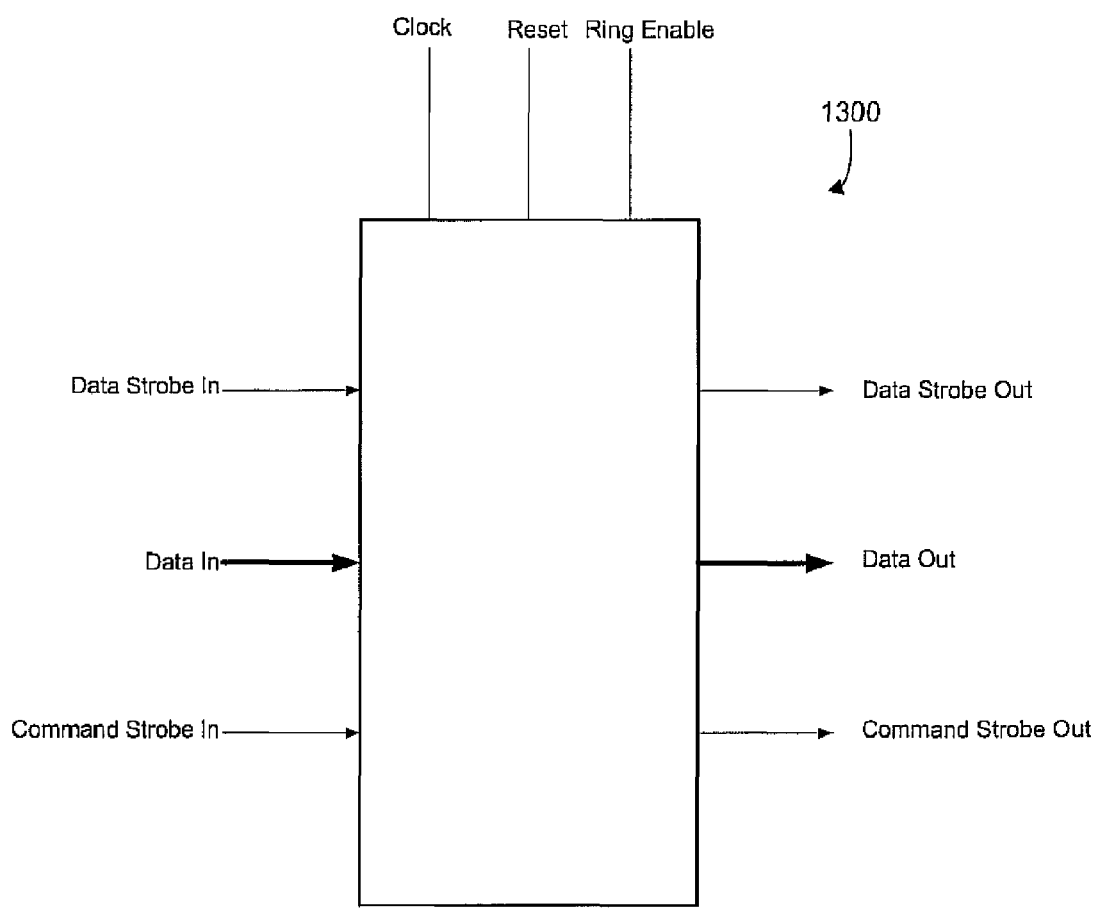
FIG. 13 shows a diagram of a single slave for a previously illustrated ring network.

FIG. 13 is diagram of a device 1300, which can be used within networks in accordance with example embodiments, and which is disclosed in additional detail in U.S. provisional patent application No. 60/902,003 entitled "Non-volatile Memory System". The device 1300 has an input port consisting of, in this case, an input data bus, and two input strobe signals that are used to indicate when information is flowing on the input data bus. Although the data bus segments are shown to be 4 bits wide, however, data width can be of any width greater or equal to one bit as the present invention is operable regardless of the data bus width. The device has an output port consisting of an output data bus and two output strobe signals to indicate when data is begin driven by the salve onto the output data bus. Again, the output data bus width of 4 bits in this an all other figures is purely exemplary and not indicative of the scope of the present invention. In addition to the input port, the output port, this particular device has a small number of additional non-power signals. The device also has a clock input (in this case single ended, but also potentially differential), a reset input to initialize the device into a known initial state, and a Chip Enable input which is used to turn on the input and output ports and thereby enable communication around the ring.

Figure 14:
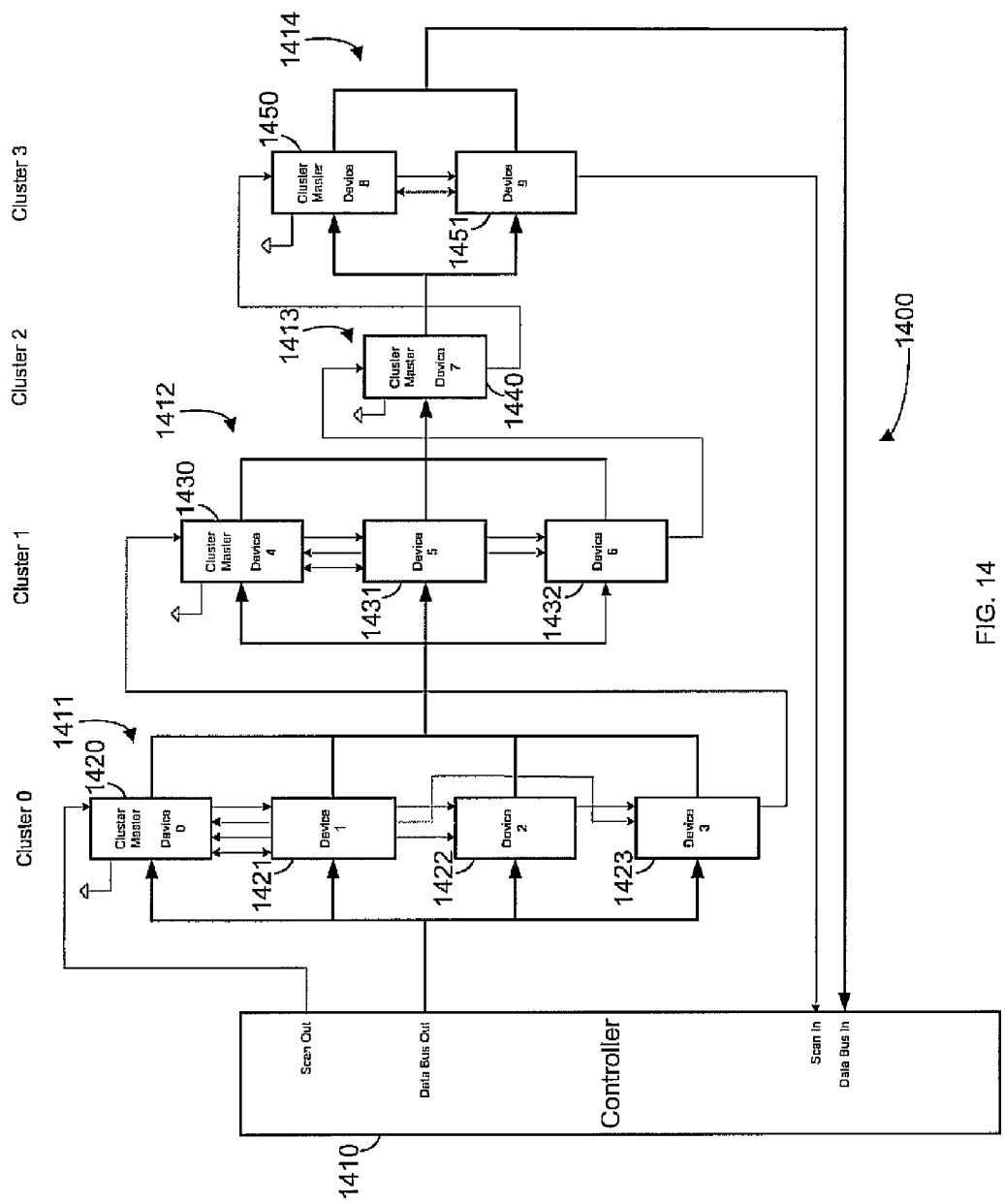
FIG. 14 illustrates a third example of a ring of clusters having a different intra-cluster communication signals arrangement than the first or second example.

FIG. 14 shows a diagram of another ring of clusters network 1400 in accordance with another example embodiment. The network 1400 includes a controller 1410 and four clusters 1411-1414. The clusters have four slaves 1420-1423, three slaves 1430-1432, one slave 1440, and two slaves 1450-1451 in them, respectively, though it is again noted that the invention is not limited to any specific range of clusters or slaves per cluster. Examples in accordance with FIG. 14 are characterized in that slave addressing is linear and not composed of a cluster number and a intra-cluster device ID. This alternative would be preferably if the number of bits available for a device address was small so that partitioning it into two distinct portions would unreasonably constrain the either the maximum of number of clusters or the maximum number of devices per cluster. In this case, the device address is set after reset by means of a single-bit serial scan chain that daisy chains through all the devices in the ring, though other such mechanisms would be obvious to one of ordinary skill in the art without undue experimentation. In this embodiment, a dedicated signal pulled high indicates which device in each cluster is to the initial or permanent cluster master. The controller would use the scan chain to initialize the device addresses and then to query all devices as to whether they were a cluster master or not, thereby determining the exact network topology. Optionally, once the topology has been determined, the controller can inform the cluster masters of the device addresses of the devices in their clusters so they understand which device addresses they need to respond to. In another alternative, the cluster masters can query the non-master slaves in their clusters to determine which devices are in their respective clusters. In another alternative, the cluster masters do not need to know the device addresses of the devices in their respective clusters and only change their behavior based on indications from those slaves that they have been primed for data out on the next Data Packet.

Certain adaptations and modifications of the described embodiments can be made. Therefore, the above discussed embodiments are considered to be illustrative and not restrictive.

I claim:

1. A memory system including a plurality of memory modules connected in a ring-of-clusters configuration, the system comprising:
    a memory controller in packetized communication with a plurality of memory modules interconnected to input and output ring segments;
    the input and output ring segments being interconnected in a ring configuration, thereby forming a cluster of memory modules that share the same input ring segment and the same output ring segment, each cluster having at least one memory module designated as a master memory module configured to control the input to each memory module in the cluster such that a packet from the same input ring segment is received by the at least some of the slave memory modules.

2. The system of claim 1, wherein the cluster includes a memory module designated as a cluster master, the cluster master being operative to coordinate slaves of the cluster so that at most one slave in the cluster is driving the output ring segment to which they are connected.

3. The system of claim 2, wherein the slaves of the cluster communicate over a single wire to the cluster master that a specific slave is enabled to drive the output ring segment.

4. The system of claim 2, wherein the slaves of the cluster communicate with the cluster master over a single multi-source single-destination conductor.

5. The system of claim 2, wherein the cluster master interprets all of the commands targeted at all slaves in the cluster enabling the cluster master to determine which slave is primed without receiving status information directly from the slaves.

6. The system of claim 2, wherein the cluster master is operative to forward command packets from the input ring segment to the output ring segment regardless of which, if any, slaves are enabled.

7. The system of claim 2, wherein the cluster master is operative to forward command packets from the input ring segment to the output ring segment regardless of which, if any, slaves are enabled.

8. The system of claim 2, wherein an enabled memory module becomes a temporary cluster master and becomes responsible for forwarding command packets and data packets from the input ring segment to the output ring segment.

9. The system of claim 8, wherein the temporary master status remains with an enabled memory module even after it is no longer enabled until such time as some other slave in the cluster becomes enabled.

10. The system of claim 1, wherein the beginning of one packet follows the end of the previous packet by at least one half cycle to allow clusters to shift responsibility for driving all of some elements of the cluster's output ring segment while no data is being transferred.

11. The system of claim 1, wherein the memory modules in a cluster are connected to the output ring segment in a wired-AND configuration.

12. The system of claim 1, wherein the memory modules in the cluster have two intra-cluster outputs and two intra-cluster inputs forming a fault-tolerant intra-cluster ring.

13. The system of claim 1, wherein one or more of the slave memory modules are located within a multi-chip module (MCM).

14. The system of claim 13, wherein the MCM further includes a controller memory module.

15. The system of claim 13, wherein:
    the MCM is implemented as a vertically integrated stack with multiple levels; and
    the memory modules of each cluster are disposed on different levels.

16. The system of claim 13, wherein:
    the MCM is implemented as a vertically integrated stack with multiple levels; and
    all the memory modules in the stack constitute a signle cluster 17. A system comprising:
    a plurality of slave memory modules, the plurality of slave memory modules comprising at least first and second clusters that collectively form part of a ring, and either the second or first cluster being a next cluster relative to the first or second cluster respectively, the second cluster comprising at least first and second slave memory modules in the ring, the first slave memory module of the second cluster connected with the second slave memory module of the second cluster, the first and second slave memory modules sharing same input and output segments and both the first and second slave memory modules receiving packets via the same input segment, each cluster having at least one memory module designated as a master memory module configured to control the input to each memory module in the cluster such that a packet from the same input ring segment is received by the at least some of the slave memory modules; and
    a controller memory module in the ring and in packetized communication with the plurality of slave memory modules.

18. The system of claim 17, wherein the slave memory modules are addressed by the controller memory module using a memory module ID, and the memory module IDs may be reset or reassigned while power is applied to the slave memory modules.

19. The system of claim 17, wherein the slave memory modules are addressed by the controller memory module using the combination of a cluster ID and a memory module ID.

20. The system of claim 19, wherein the memory module IDs, the cluster IDs, or both, may be reset or reassigned during operation.

all the memory modules in the stack constitute a single cluster.

21. The system of claim 17, wherein at least some of the slave memory modules are memory modules.

* * * * *